United States Patent [19]
Dorri et al.

[11] Patent Number: 5,253,413
[45] Date of Patent: Oct. 19, 1993

[54] METHOD FOR MAKING A SUPERCONDUCTING JOINT FOR A SUPERCONDUCTING MAGNET WHICH IMAGES HUMAN LIMBS

[75] Inventors: Bizhan Dorri, Clifton Park; Evangelos T. Laskaris; Kenneth G. Herd, both of Schenectady; Richard A. Ranze, Scotia, all of N.Y.

[73] Assignee: General Electric Company, Schenectady, N.Y.

[21] Appl. No.: 347

[22] Filed: Jan. 4, 1993

[51] Int. Cl.$^5$ ............................................. H01L 39/24
[52] U.S. Cl. ........................................ 29/599; 29/868; 505/925; 505/926; 505/927
[58] Field of Search .................. 29/599, 868; 509/925, 509/926, 927

[56] References Cited

U.S. PATENT DOCUMENTS

| | | | |
|---|---|---|---|
| 3,895,432 | 7/1975 | Diepers et al. | 29/599 |
| 4,857,675 | 8/1989 | Marancik et al. | 29/599 X |
| 5,082,164 | 1/1992 | Rumaner et al. | 29/868 X |
| 5,109,593 | 5/1992 | Benz et al. | 505/925 X |
| 5,134,040 | 7/1992 | Benz et al. | 505/927 |

FOREIGN PATENT DOCUMENTS

80/02084  10/1980  World Int. Prop. O. ............ 29/599

*Primary Examiner*—Carl J. Arbes
*Attorney, Agent, or Firm*—James R. McDaniel; Paul R. Webb, II

[57] ABSTRACT

This invention relates to a superconducting joint which is more commonly referred to as, a pigtail joint, for use in superconducting magnets. Such structures of this type, generally, exhibit total superconducting behavior at temperatures below the transition value of the superconducting joint and have high electrical resistance at temperatures above the transition point of the superconducting joint.

8 Claims, 6 Drawing Sheets

METHOD FOR MAKING A SUPERCONDUCTING JOINT FOR A SUPERCONDUCTING MAGNET WHICH IMAGES HUMAN LIMBS

BACKGROUND OF THE INVENTION

1. Field of the Invention

This invention relates to a superconducting joint which is more commonly referred to as, a pigtail joint, for use in superconducting magnets. Such structures of this type, generally, exhibit total superconducting behavior at temperatures below the transition value of the superconducting joint and have high electrical resistance at temperatures above the transition point of the superconducting joint.

2. Description of the Related Art

It is known, that regular pigtail joints are made by delaminating the copper stabilizer of the superconductor, soldering the superconductor strands together, welding a one inch region of the superconductor strands, and soldering back the top and bottom copper foils over the superconductor strands. This procedure creates a superconducting joint which has the parent copper stabilizer and is soldered together for a relatively long section. While these regular pigtail joints operate efficiently in larger superconducting magnets, these regular pigtail joints will not operate efficiently in smaller superconducting magnets because the normal state of resistance of the regular pigtail joints is too low to be used in a smaller superconducting magnet which combines this pigtail joint with a superconducting switch.

It is apparent from the above that there exists a need in the art for a superconducting joint which is light weight and compact through simplicity of parts and uniqueness of structure, and which at least equals the superconducting joint characteristics of known superconducting joints, but which at the same time exhibits total superconducting behavior at temperatures below its transition value and has high electrical resistance at temperatures above its transition point. It is a purpose of this invention to fulfill this and other needs in the art in a manner more apparent to the skilled artisan once given the following disclosure.

SUMMARY OF THE INVENTION

Generally speaking, this invention fulfills these needs by providing a method for making a superconducting joint for a superconducting magnet including first and second conductors with copper lamination, first and second sets of stainless steel pieces, an insulation means, a soldering means and a welding means, comprising the steps of: delaminating a portion of said first and second conductors; laminating said first set of stainless steel pieces to said portion of delaminated first and second conductors; insulating said laminated first and second conductors with said insulation means; soldering together said insulated first and second conductors with said solder means to create a solder joint between said first and second conductors; welding said soldered first and second conductors with said welding means; and trimming said welded first and second conductors to create said superconducting joint.

In certain preferred embodiments, the first and second copper laminations over the conductors are scarfed in the delaminating step. Also, Kapton ® is used in the insulation means.

In another further preferred embodiment, a superconducting joint is constructed which exhibits total superconducting behavior at temperatures below its transition value and has high electrical resistance at temperatures above its transition point while being able to be employed in a magnet that has a relatively small imaging volume.

The preferred superconducting joint, according to this invention, offers the following advantages: lightness in weight; ease of assembly; excellent superconducting characteristics; excellent superconducting behavior at temperatures below its transition value; high electrical resistance at temperatures above its transition point; good economy; and high strength for safety. In fact, in many of the preferred embodiments, these factors of superconducting characteristics, total superconducting behavior and high electrical resistance are optimized to an extent that is considerably higher than heretofore achieved in prior, known superconducting joints.

BRIEF DESCRIPTION OF THE DRAWINGS

The above and other features of the present invention which will be more apparent as the description proceeds are best understood by considering the following detailed description in conjunction with the accompanying drawings wherein like character represent like parts throughout the several veins and in which.

DETAILED DESCRIPTION OF THE INVENTION

Figure 1:
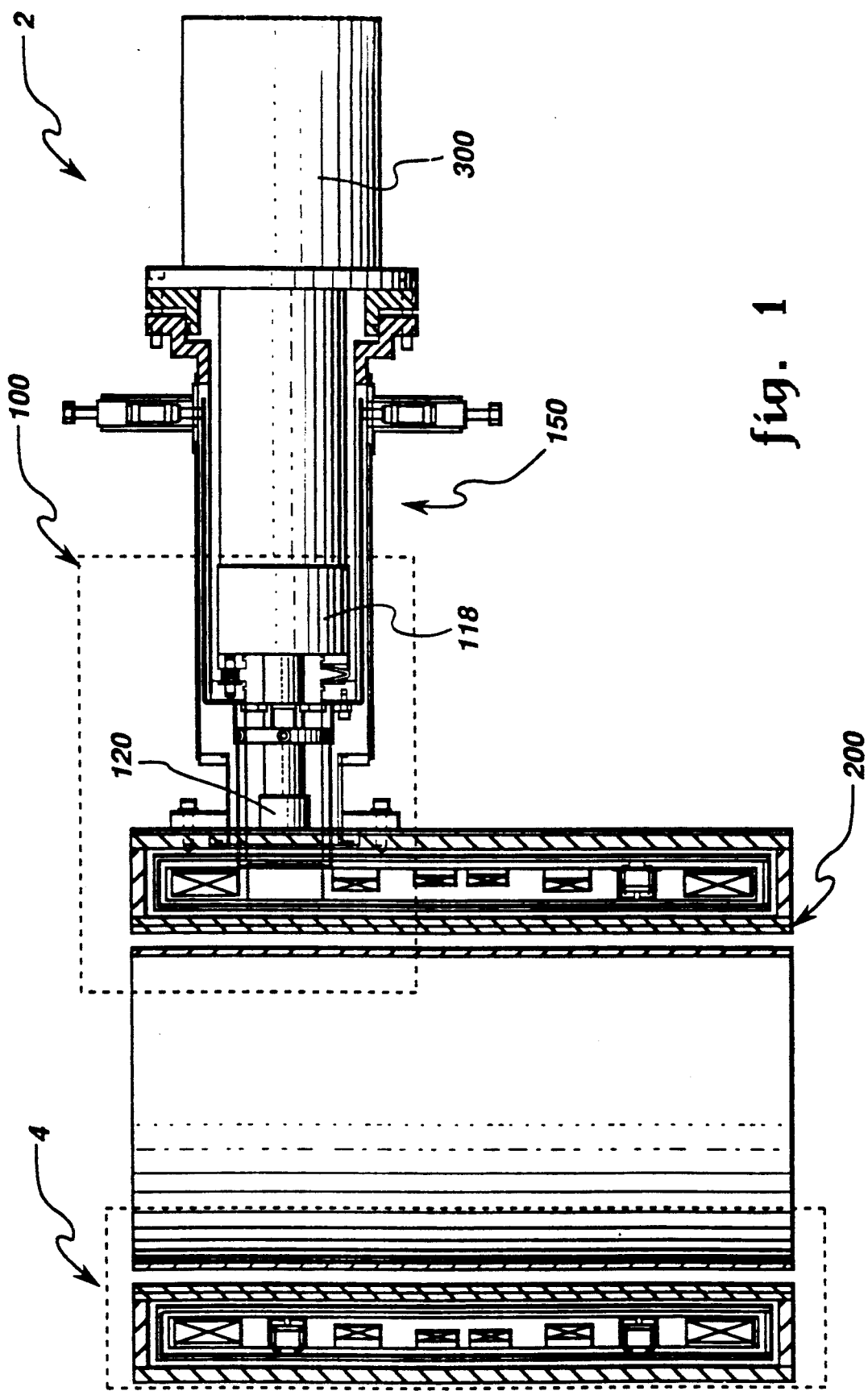
FIG. 1 is a top plan view of an eddy-current free, superconducting imaging magnet for human limbs, according to the present invention.

With reference first to FIG. 1, there is illustrated eddy current-free, superconducting imaging magnet 2 for imaging human limbs. Magnet 2 includes, in part, magnet cartridge assembly 4, High-Tc superconducting lead and magnet support assembly 100, thermal stations 118, 120, cold head sleeve assembly 150, gradient coil/passive shimming assembly 200 and cryocooler 300.

Figure 2:
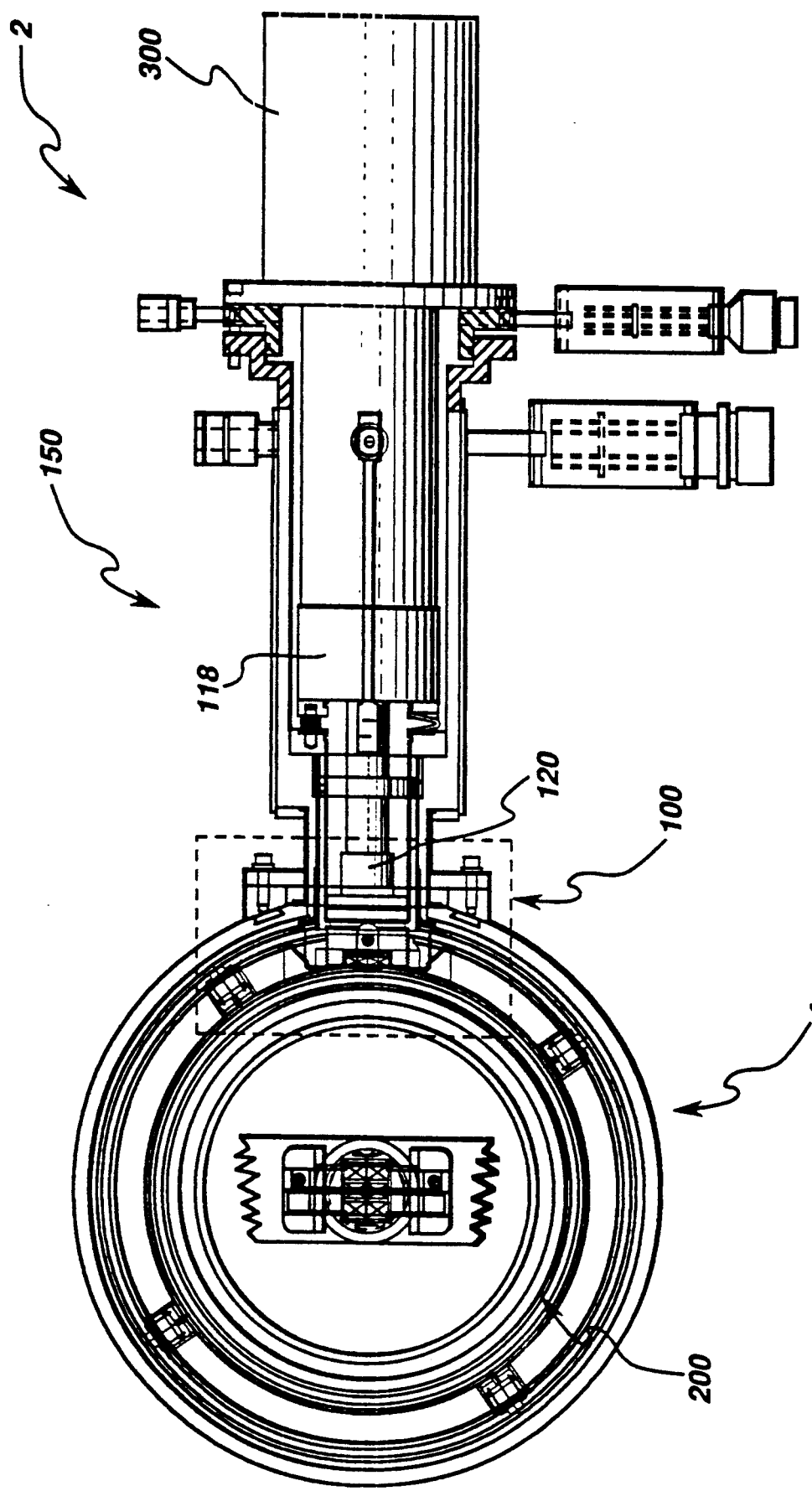
FIG. 2 is a side plan view of the eddy-current free, superconducting imaging magnet for imaging human limbs, according to the present invention.

FIG. 2 is an end view illustration of FIG. 1 in which magnet cartridge assembly 4, High-Tc superconducting lead and magnet support assembly 100, cold head sleeve assembly 150 and gradient coil/passive shim assembly 200 are also illustrated.

Figure 3:
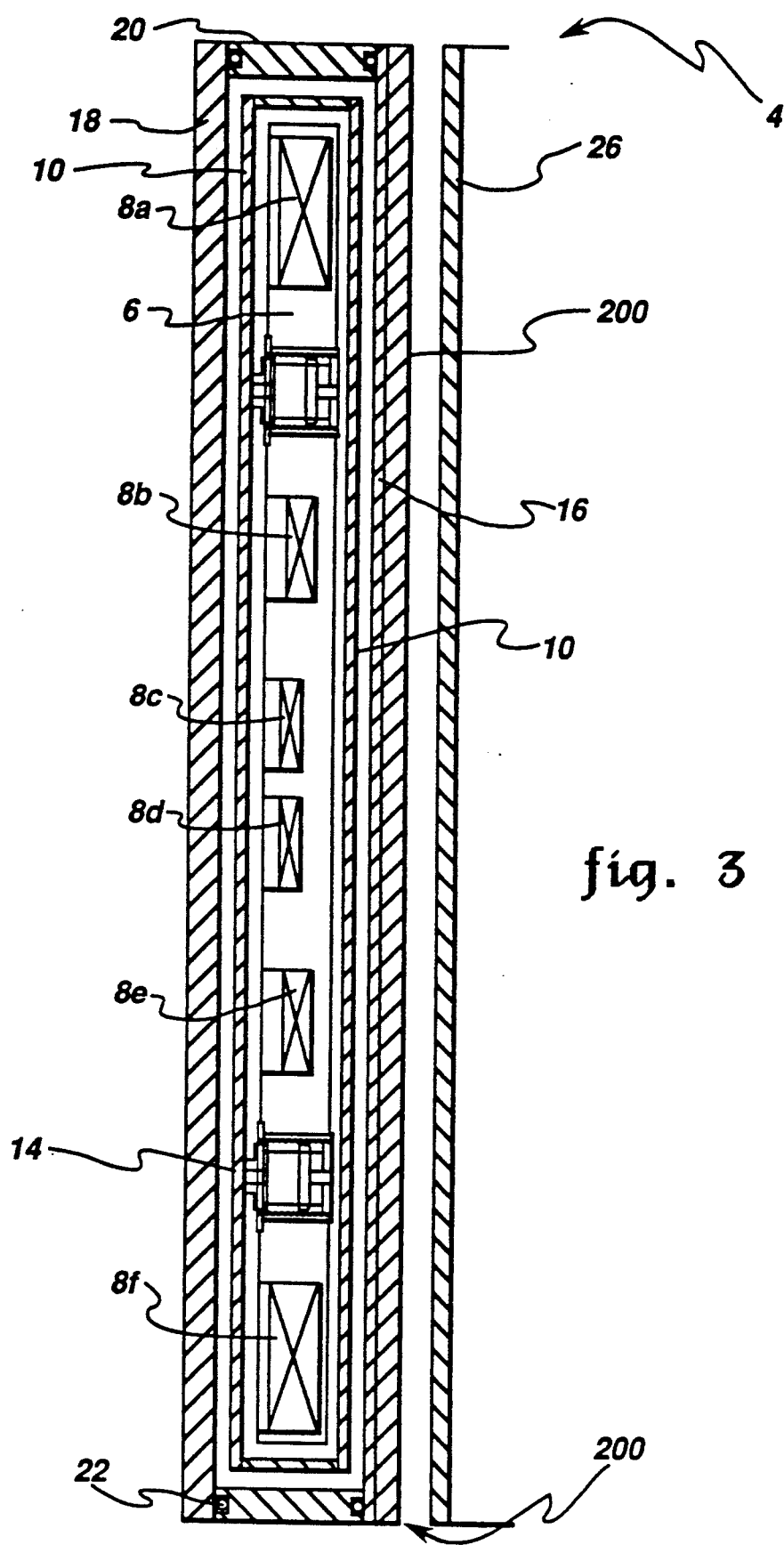
FIG. 3 is an expanded view of the mechanical support and thermal shield assembly for the eddy-current free, superconducting imaging magnet for imaging human limbs.

FIG. 3 is a detailed illustration of magnet cartridge assembly 4 as more generally shown in FIGS. 1 and 2. Magnet cartridge assembly 4 includes, in part, magnet cartridge 6, superconducting coils 8a-8f, thermal shield 10, radial shield supports 14, inner bore tube 16, vacuum enclosure 18, end plates 20, conventional elastomeric O-rings 22, RF coil 26, and gradient coil/shimming assembly 200. In particular, cartridge 6, preferably, is constructed of any suitable epoxy reinforced fiberglass with copper wires (not shown) for axial thermal conduction. Coil 8a-8f are constructed of any suitable superconducting coil material. Thermal shield 10, preferably, is constructed of any suitable epoxy reinforced fiberglass material and copper wire. Bore tube 16, enclosure 18 and end plates 20, preferably, are constructed of any suitable epoxy reinforced material with stainless steel. Supports 14 are used to rigidly attach thermal shield 10 to cartridge 6 such that the heat transference from shield 10 to cartridge 6 can be minimized as magnet 2 is operating.

Figure 4:
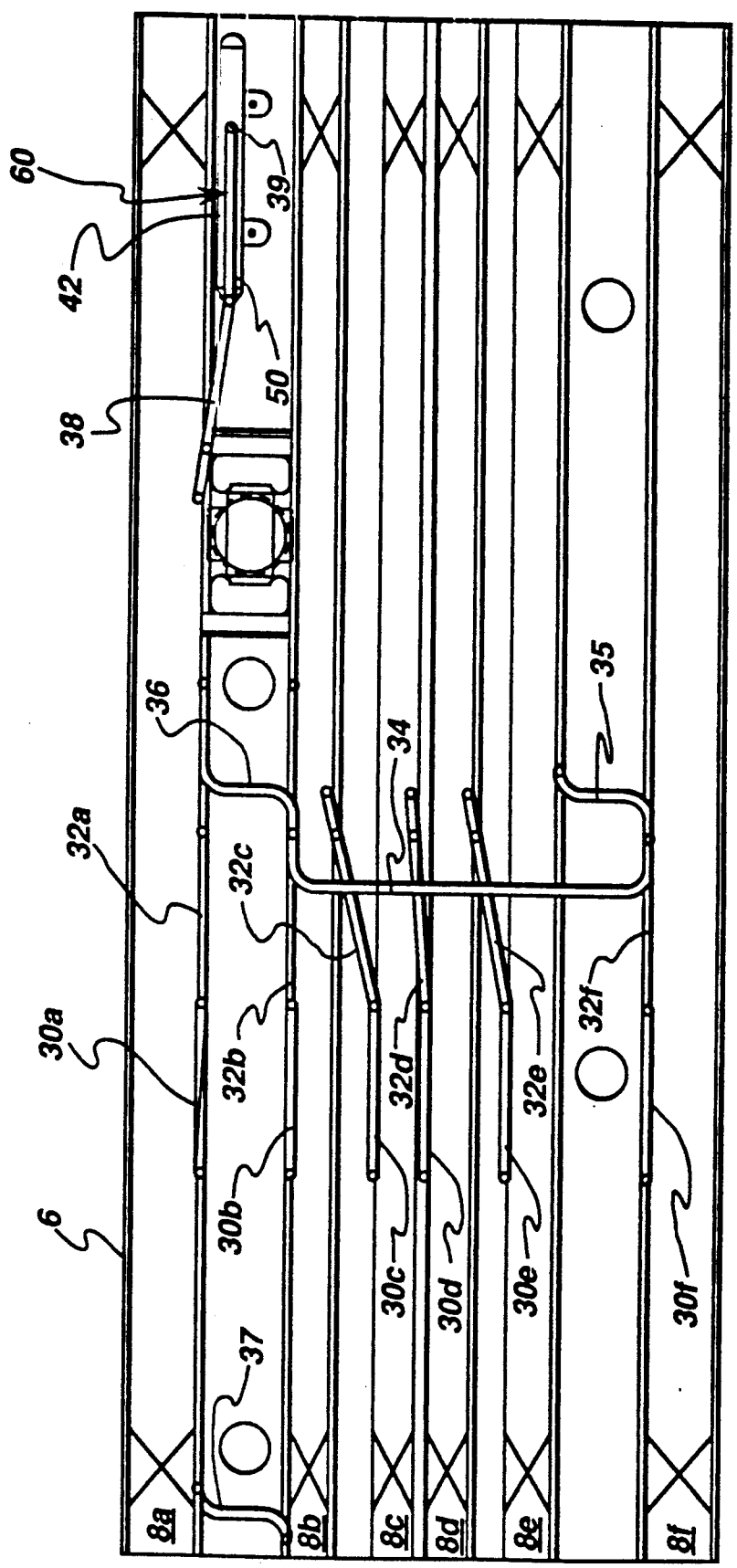
FIG. 4 is a detailed view of the coil form for the eddy-current free, superconducting imaging magnet for imaging human limbs, according to the present invention.

FIG. 4 illustrates in plan view how conductor windings 8a-8f are wound on cartridge 6. In particular, conductor 42 which is initially located in switch assembly 60, is traversed along ramp 38 and wound by conventional winding techniques to form winding 8a. Conductor 42 then exits down ramps 30a and 32a to ramp 37. Conductor 42 then exits ramp 37 and enters ramps 30b and 32b to form winding 8b. Winding 8b is then formed by conventional winding techniques. After winding 8b is formed, conductor 42 then traverses along ramps 32c and 30c to form winding 8c. After conductor 42 exits ramps 32c and 30c, winding 8c is formed by conventional winding techniques. After winding 8c is formed, conductor 42 traverses along ramps 32d and 30d to form winding 8d where winding 8d is formed by conventional winding techniques. After winding 8d is formed, conductor 42 then traverses along ramps 32e and 30e where winding 8e is formed by conventional winding techniques. After winding 8e is formed, conductor 42 then traverses along ramps 35, 32f, and 30f where winding 8f is formed by conventional winding techniques. After winding 8f is formed, conductor 42 then traverses along back ramp 36 and back along ramp 38 to form conductor end 50. A pigtail joint 39 is formed between conductors 42 and 50 in superconducting switch assembly 60.

Figure 5A:
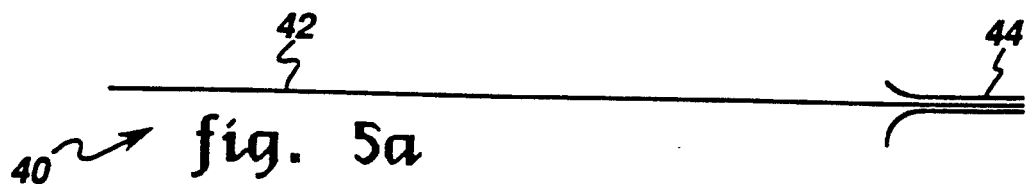
FIGS. 5a-5f illustrate the methods for making a superconducting joint for the eddy-current free, superconducting imaging magnet for imaging human limbs, according to the present invention.

With respect to FIGS. 5a-5f, there is illustrated the various steps for making the superconducting pigtail joint 39 in switch assembly 60. In particular, the operator measures the two conductors 42, 50 which make pigtail 39, to one inch longer than the end of switch assembly 60 and cuts conductors 42, 50. The operator then delaminates each conductor 42, 50 to 6⅞" back with a conventional delaminator and cuts with a conventional scarf. In this process, the operator also conventionally delaminates one inch of conductors 42, 50 in addition to 6⅞" in order to allow for the scarfing of the copper strip 44 and then while the chill blocks (not shown) are kept hot, partial relamination is done leaving some part of the copper 44 unlaminated (relaminate to ⅛" diameter pins), as shown in FIG. 5a. It is to be understood that for the sake of simplicity, only conductor 42 is initially illustrated until assembly 40 is almost completely assembled. The process is the same for conductor 50.

Figure 5B:
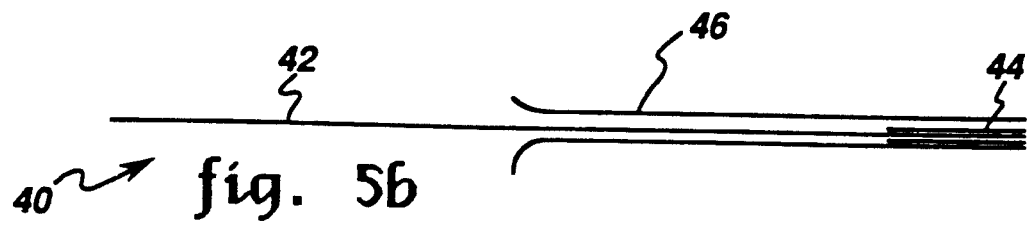

As shown in FIG. 5b, the operator cuts a 9 inch long, one mil thick stainless steel foil 46 with a scarf at one end, (two pieces per conductor). Next the operator measures at least 9 inches plus 3.5 inches (12.5 inches) from the end of conductors 42, 50 and marks this area to denote the beginning of the stainless steel lamination. The operator then positions the lower stainless steel foil 46 to the copper strip 44 with a conventional solder paste (not shown). Then the operator positions the 12.5 inch mark to the end of the stainless steel foil 46 (non-scarfed end) The operator then hand solders for one inch while maintaining alignment of the stainless steel foil 46 and conductor 42 as shown in FIG. 5b. Next, the operator prepastes the top side of conductor 42 and then positions the top of the stainless steel 46 to the 12.5 inch mark and solders for 1 inch. The operator then positions this subassembly to a conventional relamination block (not shown) with ¾ inch of the presoldered assembly outside of the relamination blocks. The operator heats up the relamination blocks to approximately 200° C. and starts the relamination process while maintaining the position of the stainless steel foil 46 (using wet conventional cotton swabs to prevent delamination of the ¾ inch area). This relamination stops before the ends in order to keep the scarfs from soldering to the conductor 42.

Figure 5C:
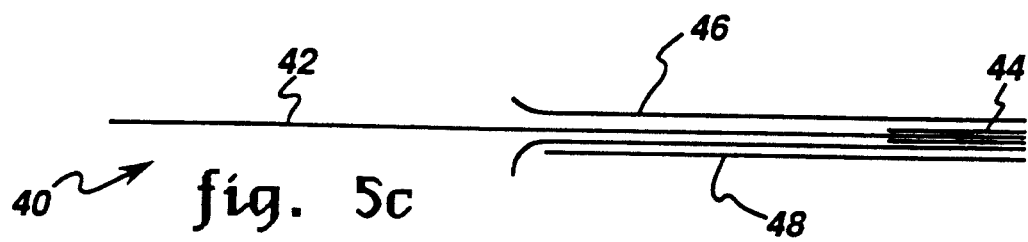

With respect to FIG. 5c, a length of Kapton ® 48 for insulation is cut and attached to the bottom side of the upper conductor 42. The operator starts the Kapton ® 48 at 3¾ from the end of conductor 42. This point is on the loose part of the scarf of the stainless steel foil 46. The operator then gently presses down for proper contact. Finally, the operator trims both sides for the entire length as close as possible. Additional pieces of Kapton ® 48 may be necessary for the rest of the length.

Figure 5D:
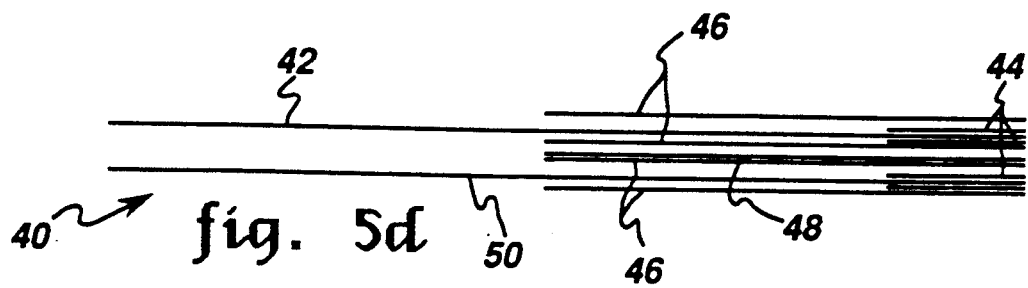

With respect to FIG. 5d, the operator positions both conductors 42, 50 in the relamination blocks while maintaining complete alignment (the un-scarfed end of the stainless steel 46 can be used for this alignment). The operator then starts with the stainless steel foil 46 in the blocks, heats the relamination blocks to approximately 200° C. and pulls assembly 40 through the relamination blocks, stopping before the stainless steel foil 46 leaves the blocks (to approximately 1 inch of the stainless steel part in the blocks).

Figure 5E:
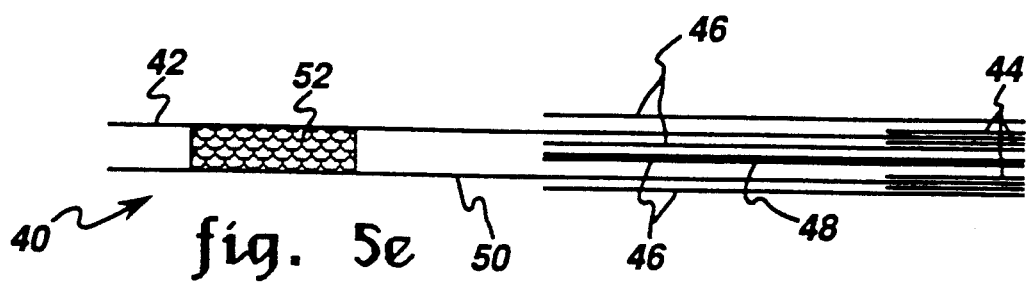

With respect to FIG. 5e, the operator then cools the system 40 down and removes the cover and face plate (not shown) before trying to remove superconductor assembly 40 from the block. The operator then positions the superconductor assembly 40 in the slot guide (not shown) to finish soldering (by hand). If conductors 42, 50 are misaligned, the operator merely has to solder them outside of the slot guide. The operator then positions the 1 inch (from the end) and the 2¼ inch mark to the tapers of the welding chill block (not shown). This will ensure a location of weld 52 which will be approximately 1¼ inch long and 1 inch from the end of conductors 42, 50. The operator then makes a conventional superconducting weld 52. It is to be understood that all markings should be done with a soft, blunt marker without pressure.

Figure 5F:
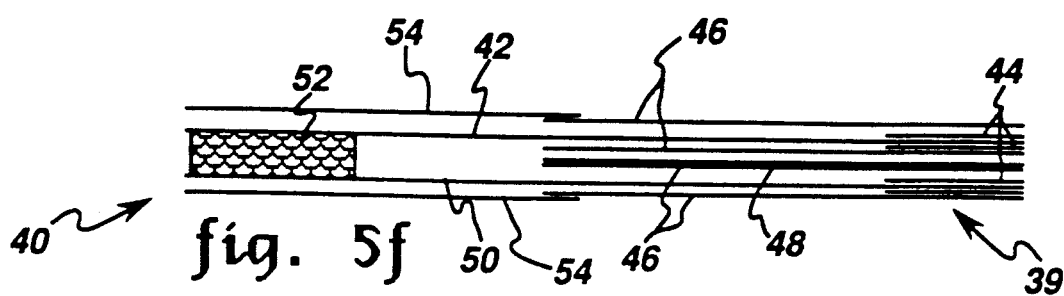

With respect to FIG. 5f, the operator carefully cuts the end of conductors 42, 50 to about 1/16 inch from weld 52 (not cutting any outer region). This is approximately 1 inch. The operator then cuts two pieces of stainless steel 54, each about 3 inches long, scarfing only one end of each. The operator then prepastes one stainless steel piece 54 which is positioned to the heat block (not shown) on the scarfed end towards of the front of the heat block. The operator then positions an end of weld 52 to line up with the un-scarfed stainless steel piece 54. The operator prepastes a second stainless steel piece 54, maintaining scarfs in opposite directions, and another piece 54 is positioned on weld 52 similar to the lower piece. Next the operator positions the heat block cover (not shown) and carefully tightens with a conventional spring loaded screw. This assembly is heated to approximately 200° C. and held for 30 seconds. The heating is then stopped and the assembly is cooled. Finally, the operator disassembles the cover, removes the front plate to remove the weld 52, and removes superconductor assembly 40 which includes pigtail joint 39. It is to be understood if any sticking occurs, the operator merely has to apply alcohol to breakdown the fluxes.

Figure 6A:
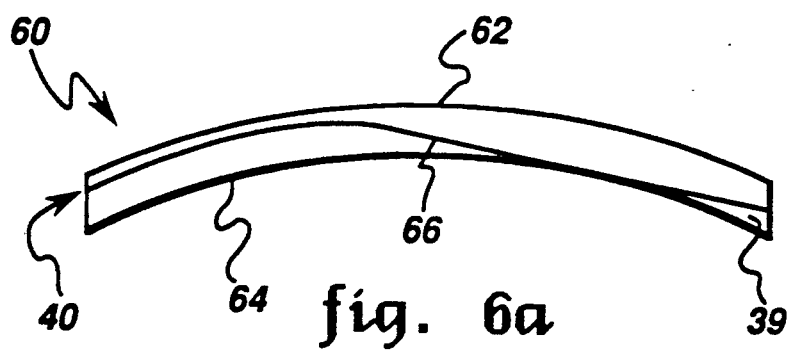
FIGS. 6a and 6b illustrate a side view and an end view, respectively of a housing for a persistent superconducting switch for the eddy-current free, superconducting imaging magnet for imaging human limbs, according to the present invention.

Once pigtail joint 39 is formed in superconducting assembly 40, assembly 40 is placed in persistent superconducting switch assembly 60 as shown in FIG. 6a. Assembly 60 includes, in part, top cover 62, bottom plate 64 and conductor groove 66. Top cover 63 and bottom plate 64, preferably, are constructed of copper. Groove 66, preferably, is machined in assembly 60 by conventional machining techniques.

Figure 6B:

With respect to FIG. 6b, there is illustrated an end view of switch assembly 60 that was previously illustrated in FIG. 6a. As can be seen in FIG. 6b, assembly 60 includes top cover 62, bottom plate 64 and conductor groove 66.

Figure 7A:
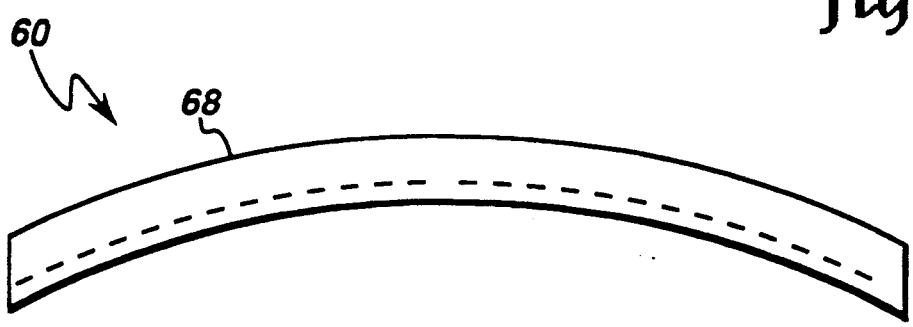
FIGS. 7a and 7b illustrate a side view and an end view, respectively, of a holder for the persistent superconducting switch for the eddy-current free, superconducting imaging magnet for imaging human limbs, according to the present invention.
Figure 7B:
Figure 8:
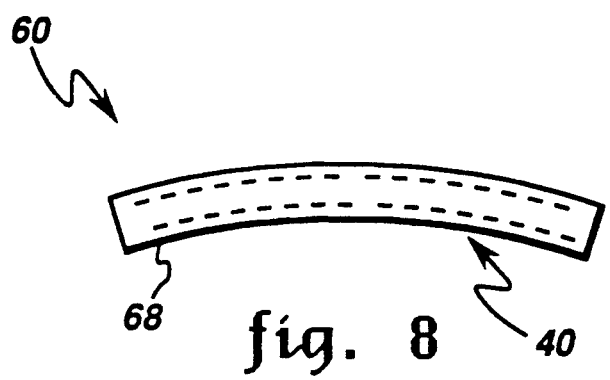
FIG. 8 illustrates the complete persistent superconducting switch for the eddy-current free, superconducting imaging magnet for imaging human limbs, according to the present invention.

After superconductor assembly 40 is placed within switch assembly 60, this assembly is then placed into holder 68 (FIG. 7a) as shown in FIG. 8. Holder 68 is a U-shaped holder as shown in FIG. 7b and is constructed, preferably, of any suitable epoxy-reinforced fiberglass.

As shown in FIG. 8, once superconducting assembly 40 is placed within assembly 60 and holder 68, persistent superconducting switch assembly 60 is formed. This persistent superconducting switch assembly 60 is then rigidly attached to cartridge 6 by conventional fasteners as shown in FIG. 4.

The uniqueness of switch assembly 60 will now be described. In order to allow a superconducting magnet to assume a persistent mode of operation, a superconducting switch must be installed in parallel to the magnet and the power supply which is used ramp the magnet. During ramping, the superconducting switch 60 is heated up to above its transition temperature, therefore, it will be in the normal resistive state. The current from the power supply is fed into the superconducting magnet 2. If the superconducting magnet inductance is L, the final electric current to be supplied to the magnet is I, and the duration of time in which the magnet should be ramped is t, then the voltage that the power supply needs to be set it at is:

$$V = LI/t \qquad (1)$$

This voltage (V) is directly imposed across the superconducting switch assembly 60, as well. If the normal state resistance of the switch assembly 60 is R, then the heating in the switch assembly 60 from this voltage is:

$$V^2/R \qquad (2)$$

In order to prevent the superconducting switch assembly 60 from overheating, this heating rate has to be small which means that R, the normal state resistance of the switch assembly 60 is to be large.

Once magnet 2 reaches its designed electrical current, the voltage is reduced to zero (a very small value to compensate for resistive losses in the current lead assembly 100 (FIG. 1)) and the superconducting switch assembly 60 is allowed to cool down and assume superconducting state. Once in the superconducting state, the power supply (not shown) is removed and a magnet 2 is in persistent mode. In order to achieve a timely cooldown of the switch assembly 60, its thermal mass has to be sufficiently small. Thus, in this invention, the length of the conductor 42, 50 (FIGS. 5a-5f) which has stainless steel lamination 46, 54, will act as the superconducting switch assembly 60 (FIG. 8). This length of the conductor, 42, 50, which is about 6 to 8 inches, has a large enough resistance to allow the ramping of the magnet 2 to occur in about 20 minutes.

A protection scheme is devised to ensure the survival of the superconducting switch 60. Two scenarios can cause the magnet 2 to dump its entire energy, which is approximately 4 KJ, into the superconducting switch 60. First, if during the ramping of the magnet 2, one or both current leads fail and burn (open), all the magnet energy will be dumped into the switch assembly 60. Second, if during the persistent mode of operation, due to any cause, the superconducting switch 60 quenches, i.e. becomes resistive, all of the magnet 2 energy will be dumped into the switch assembly 60.

In order to protect the superconducting switch 40 from burning, a resistive shunt made out of brass (not shown) is electrically attached in parallel to the magnet 2 and to the superconducting switch 60. This brass shunt has a length of approximately 70 inches, width of about 1.3 inch and a thickness of 10 mils. This brass shunt is thermally attached to the magnet 2 station. Due to its resistance ratio, this brass shunt absorbs more than 90% of the magnet energy, thereby protecting the superconducting switch 60 from burning.

Once given the above disclosure, many other features, modification or improvements will become apparent to the skilled artisan. Such features, modifications or improvements are, therefore, considered to be a part of this invention, the scope of which is to be determined by the following claims.

What is claimed is:

1. A method for making a superconducting joint for a superconducting magnet including first and second conductors having copper lamination, a first and second sets of stainless steel pieces, an insulation means, a soldering means and a welding means, wherein said method is comprised of the steps of:

delaminating a portion of said first and second conductors;

laminating said first set of stainless steel pieces to said portion of delaminated first and second conductors;

insulating said laminated first and second conductors with said insulation means;

soldering together said insulated first and second conductors with said soldering means to create a solder joint between said first and second conductors;

welding said soldered first and second conductors with said welding means; and trimming said welded first and second conductors to create said superconducting joint.

2. The method, as in claim 1, wherein said delaminating step is further comprised of the step of:

creating a scarf at a predetermined position on said first and second conductor.

3. The method, as in claim 2, wherein said scarf is further comprised of:

copper.

4. The method, as in claim 1, wherein said laminating step is further comprised of the steps of:

determining a position for a beginning of said lamination step;

positioning said first set of stainless steel pieces over said delaminated first and second conductors;

pasting said first set of stainless steel pieces to said first and second conductors; and laminating said pasted first set of stainless steel pieces to said first and second conductors.

5. The method, as in claim 1, wherein said insulation means is further comprised of:

Kapton ®.

6. The method, as in claim 1, wherein said insulating step is further comprised of the steps of:

placing a predetermined length of insulation over said first set of stainless steel pieces at a predetermined distance along said first and second conductors;

pressing said insulation means into said first set of stainless steel pieces; and relaminating said first set of stainless steel pieces and said first and second conductors with said insulation in between.

7. The method, as in claim 1, wherein said soldering step is further comprised of the steps of:

positioning said insulated first and second conductors in said soldering means;

determining a location of said solder joint on said first and second conductors, and creating said solder joint between said first and second conductors.

8. The method, as in claim 1, wherein said welding step is further comprised of the steps of:

making approximately a 1¼ inch long weld;

removing a predetermined portion of said first and second conductors adjacent to said weld joint;

locating said second set of stainless steel pieces along a predetermined position on said soldered first and second conductors; and relaminating said second set of stainless steel pieces to said soldered first and second conductors.

* * * * *